United States Patent
Takeuchi et al.

(10) Patent No.: US 7,928,496 B2
(45) Date of Patent: Apr. 19, 2011

(54) SEMICONDUCTOR MEMORY DEVICE AND MANUFACTURING METHOD THEREOF

(75) Inventors: Wakako Takeuchi, Yokohama (JP); Hiroshi Akahori, Yokohama (JP); Atsuhiro Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 11/808,147

(22) Filed: Jun. 7, 2007

(65) Prior Publication Data

US 2007/0287253 A1 Dec. 13, 2007

(30) Foreign Application Priority Data

Jun. 8, 2006 (JP) ................................. 2006-160084

(51) Int. Cl.
*H01L 29/788* (2006.01)
*H01L 29/792* (2006.01)

(52) U.S. Cl. ................. 257/316; 257/324; 257/E29.129; 257/E29.132; 257/E29.309

(58) Field of Classification Search .................. 257/316, 257/321, 324, 325, 410, 411, 637, 649, E21.258, 257/E21.293, E21.552, E29.129, E29.132, 257/E29.309; 365/182, 184; 438/624, 791, 438/758

See application file for complete search history.

(56) References Cited

U.S. PATENT DOCUMENTS

| | | | |
|---|---|---|---|
| 4,996,081 A * | 2/1991 | Ellul et al. | 438/762 |
| 6,093,956 A * | 7/2000 | Moore et al. | 257/635 |
| 6,756,634 B2 | 6/2004 | Helm et al. | |

FOREIGN PATENT DOCUMENTS

| | | |
|---|---|---|
| JP | 01-170049 | 7/1989 |
| JP | 04-320378 | 11/1992 |
| JP | 8-288412 | 11/1996 |
| JP | 9-213820 | 8/1997 |
| JP | 2000-174149 | 6/2000 |

OTHER PUBLICATIONS

Kärcher, et al., "Electronic structure of hydrogenated and unhydrogenated amorphous $SiN_x$ ($0 \leq x \leq 1.6$): A photoemission study", Physical Review B, vol. 30, No. 4, pp. 1896-1910, (Aug. 15, 1984).

Notification of Reasons for Rejection mailed Mar. 31, 2009, from the Japanese Patent Office in counterpart Japanese Application No. 2006-160084, and an English language translation thereof.

* cited by examiner

Primary Examiner — Ngan Ngo
(74) Attorney, Agent, or Firm — Finnegan, Henderson, Farabow, Garrett & Dunner, L.L.P.

(57) ABSTRACT

A nonvolatile semiconductor memory device having high charge retention characteristics and capable of improving leakage characteristics of a dielectric film disposed between a charge storage layer and a control gate electrode, and manufacturing method thereof is disclosed. According to one aspect, there is provided a semiconductor memory device comprising a first electrode disposed on a first insulator on a semiconductor substrate, a second insulator disposed on the first electrode, a second electrode disposed on the second insulator, and diffusion layers disposed in the semiconductor substrate, wherein the second insulator including a silicon-rich silicon nitride film containing more silicon than that in a stoichiometric silicon nitride film, and a silicon oxide film formed on the silicon-rich silicon nitride film, and wherein the silicon-rich silicon nitride film has a ratio of a silicon concentration and a nitrogen concentration set to 1:0.9 to 1:1.2.

6 Claims, 6 Drawing Sheets

SEMICONDUCTOR MEMORY DEVICE AND MANUFACTURING METHOD THEREOF

CROSS-REFERENCE TO RELATED APPLICATIONS

This application is based upon and claims the benefit of priority from prior Japanese Patent Application No. 2006-160084, filed Jun. 8, 2006, the entire contents of which are incorporated herein by reference.

BACKGROUND OF THE INVENTION

1. Field of the Invention

The present invention relates to a semiconductor memory device and manufacturing method thereof, and more particularly to a nonvolatile semiconductor memory device for storing information in a charge storage layer, and manufacturing method thereof.

2. Description of the Related Art

In a nonvolatile semiconductor memory device such as a floating gate type nonvolatile semiconductor memory device or a metal-oxide-nitride-oxide-semiconductor (MONOS) type nonvolatile semiconductor memory device, information charge is stored in a charge storage layer. Miniaturization of a semiconductor device has resulted in a reduction in the amount of charge stored in the charge storage layer. Thus, to secure data retention characteristics of the nonvolatile semiconductor memory device, it is important to suppress leakage of information charge from the charge storage layer.

For example, the floating gate type nonvolatile semiconductor memory device includes a floating gate electrode for storing charge and a control gate electrode for controlling an operation of the semiconductor device. An interelectrode dielectric (referred as an interpoly dielectric, hereinafter) is formed between the floating gate electrode and the control gate electrode. In a conventional nonvolatile semiconductor memory device, for example, a so-called ONO film constituted of a first silicon oxide ($SiO_2$) film, a silicon nitride ($Si_3N_4$) film and a second $SiO_2$ film has widely been used as the interpoly dielectric.

If charge stored in the floating gate electrode leaks to the control gate electrode through the interpoly dielectric, the data retention characteristics of the nonvolatile semiconductor memory device is deteriorated.

One of technologies to improve leakage characteristics of the interpoly dielectric is disclosed in Jpn. Pat. Appln. KOKAI Publication No. 8-288412. According to this technology, an ONO film which is an interpoly dielectric includes an $SiO_2$ film formed by thermally oxidizing a floating gate electrode, an $Si_3N_4$ film formed by chemical vapor deposition (CVD), and an $SiO_2$ film formed by thermally oxidizing a silicon-containing film, such as an $Si_xN^y$ film ($x \neq 3$, $y \neq 4$), formed by CVD.

One of technologies suitable for forming a thinner interpoly dielectric is disclosed in Jpn. Pat. Appln. KOKAI Publication No. 9-213820. According to this technology, the interpoly dielectric is formed as follows. First, a silicon oxide film is formed on a floating gate electrode by CVD. Then, a part of the silicon oxide film is converted into a silicon oxynitride film by heat treatment in an atmosphere containing nitrogen monoxide. As a result, an interpoly dielectric having a larger dielectric constant is formed. A nonvolatile semiconductor memory device that uses this interpoly dielectric has excellent charge retention characteristics because it can suppress a leakage current.

BRIEF SUMMARY OF THE INVENTION

According to one aspect of the present invention, there is provided a semiconductor memory device comprising: a first insulator formed on a semiconductor substrate; a first electrode disposed on the first insulator; a second insulator disposed on the first electrode; a second electrode disposed on the second insulator; and diffusion layers disposed in the semiconductor substrate, and disposing the first and second electrodes in-between, wherein the second insulator including: a silicon-rich silicon nitride film containing more silicon than that in a silicon nitride film with a stoichiometric composition; and a silicon oxide film formed on the silicon-rich silicon nitride film, and wherein the silicon-rich silicon nitride film has a ratio of a silicon concentration and a nitrogen concentration set to 1:0.9 to 1:1.2 ($SiN_x$, where $0.9 \leq x \leq 1.2$).

According to another aspect of the present invention, there is provided a semiconductor memory device comprising: a first insulator formed on a semiconductor substrate; a first electrode disposed on the first insulator; a second insulator disposed on the first electrode; a second electrode disposed on the second insulator; and diffusion layers disposed in the semiconductor substrate, and disposing the first and second electrodes in-between, wherein the second insulator including: a low hydrogen silicon nitride film having a hydrogen concentration of 1% or less; and a silicon oxide film formed on the low hydrogen silicon nitride film.

According to another aspect of the present invention, there is provided a semiconductor memory device comprising: a first insulator formed on a semiconductor substrate; a charge storage film disposed on the first insulator; a second insulator disposed on the charge storage film; an electrode disposed on the second insulator; and diffusion layers disposed in the semiconductor substrate, and disposing the electrode in-between, wherein the charge storage film is made of a silicon-rich silicon nitride film containing more silicon than that in a silicon nitride film with a stoichiometric composition, the silicon-rich silicon nitride film has a ratio of a silicon concentration and a nitrogen concentration of 1:0.9 to 1:1.2 ($SiN_x$, where $0.9 \leq x \leq 1.2$), and wherein the second insulator is made of a silicon oxide film.

According to another aspect of the present invention, there is provided a semiconductor memory device comprising: a first insulator formed on a semiconductor substrate; a charge storage film disposed on the first insulator; a second insulator disposed on the charge storage film; an electrode disposed on the second insulator; and diffusion layers disposed in the semiconductor substrate, and disposing the electrode in-between, wherein the charge storage film includes a low hydrogen silicon nitride film having a hydrogen concentration of 1% or less, and wherein the second insulator is a silicon oxide film.

According to another aspect of the present invention, there is provided a method of manufacturing a semiconductor memory device, comprising: forming a first insulator on a semiconductor substrate; depositing a first conductor film on the first insulator; forming a second insulator on the first conductor film; depositing a silicon-rich silicon nitride film on the second insulator by stacking silicon nitride film(s) having a stoichiometric composition of several molecular layers and silicon film(s) of several atomic layers, the silicon-rich silicon nitride film containing more silicon than that in a silicon nitride film with a stoichiometric composition; forming a silicon oxide film on the silicon-rich silicon nitride film; depositing a second conductor film on the silicon oxide film; forming a gate electrode by patterning the second conductor film, the silicon oxide film, the silicon-rich silicon nitride film, the second insulator, and the first conductor film; and forming diffusion layers in the semiconductor substrate disposing the gate electrode in-between, wherein, in the silicon-rich silicon nitride film, a ratio of layer numbers between atomic layers of the silicon film and molecular layers of the stoichiometric silicon nitride film ranges from 0.33:1 to 1.44:1.

According to another aspect of the present invention, there is provided a method of manufacturing a semiconductor memory device, comprising: forming a first insulator on a semiconductor substrate; depositing a silicon-rich silicon nitride film on the first insulator by stacking silicon nitride film(s) having a stoichiometric composition of several molecular layers and silicon film(s) of several atomic layers, the silicon-rich silicon nitride film containing more silicon than that in a silicon nitride film with a stoichiometric composition; forming a second insulator on the silicon-rich silicon nitride film; depositing a conductor film on the second insulator; forming a gate electrode by patterning the conductor film; and forming diffusion layers in the semiconductor substrate disposing the gate electrode in-between, wherein, in the silicon-rich silicon nitride film, a ratio of layer numbers between atomic layers of the silicon film and molecular layers of the stoichiometric silicon nitride film ranges from 0.33:1 to 1.44:1.

According to another aspect of the present invention, there is provided a method of manufacturing a semiconductor memory device, comprising: forming a first insulator on a semiconductor substrate; depositing a low hydrogen silicon nitride film on the first insulator, the low hydrogen silicon nitride film having a hydrogen concentration of 1% or less; forming a second insulator on the low hydrogen silicon nitride film; depositing a conductor film on the second insulator; forming a gate electrode by patterning the conductor film; and forming diffusion layers in the semiconductor substrate disposing the gate electrode in-between.

DETAILED DESCRIPTION OF THE INVENTION

Figure 1:
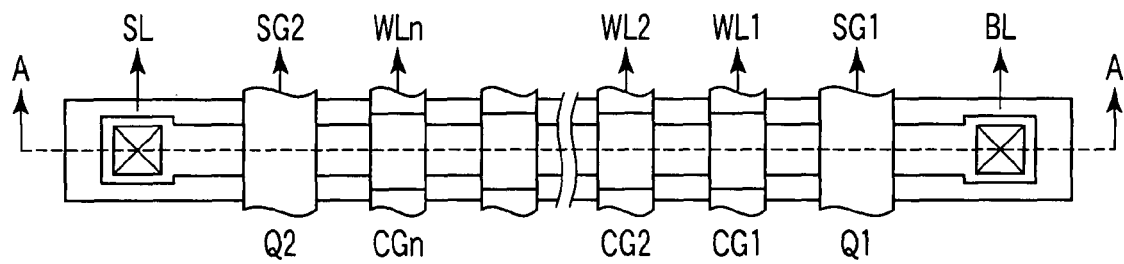
FIG. 1 is a plane diagram of an example of a NAND-type nonvolatile semiconductor memory device according to a first embodiment of the present invention.

The embodiments of the present invention provide a nonvolatile semiconductor memory device having high charge retention characteristics and capable of improving leakage characteristics of a dielectric film disposed between a charge storage layer and a control gate electrode, and manufacturing method thereof.

The embodiments of the present invention will be described with reference to the accompanying drawings. Throughout the drawings, corresponding portions are denoted by corresponding reference numerals. Each of the following embodiments is illustrated by way of example, however, the present invention can be variously modified and implemented without departing from the spirit of the present invention.

In a nonvolatile semiconductor memory device which uses a so-called ONO film including a first silicon oxide ($SiO_2$) film, a silicon nitride ($Si_3N_4$) film, and a second $SiO_2$ film, especially in a MONOS-type nonvolatile semiconductor memory device, it is important to suppress leak current from a charge storage layer, i.e., an $Si_3N_4$ film, to a control gate electrode through the second $SiO_2$ film.

In a floating gate type nonvolatile semiconductor memory device, if an ONO film is used as an inter-electrode dielectric (referred as an interpoly dielectric, hereinafter), some of charges (electrons) stored in a floating gate electrode relatively easily move from the floating gate electrode to a middle $Si_3N_4$ film through a first $SiO_2$ film of the ONO film. As long as the charges (electrons) are retained in the $Si_3N_4$ film, charge retention characteristics of the nonvolatile semiconductor memory device are not deteriorated. However, it has been discovered that miniaturization of the semiconductor device has been accompanied by thinning of the second $SiO_2$ film, thereby causing leakage of the charge from the $Si_3N_4$ film to the control gate electrode through the second $SiO_2$ film.

According to embodiments of the present invention, it can be provided a nonvolatile semiconductor memory device having high charge retention characteristics and capable of reducing, for example, leak current through an interpoly dielectric by changing characteristics of a silicon nitride film therein, and manufacturing method thereof.

The embodiments of the present invention will be described below by taking an example of a floating gate type nonvolatile semiconductor memory device. However, the invention can be applied to other nonvolatile semiconductor memory devices using an ONO film such as a MONOS-type nonvolatile semiconductor memory device.

First Embodiment

According to a first embodiment of the present invention, an interpoly dielectric containing a silicon nitride film whose silicon (Si) content is greater than that of a stoichiometric composition ($SiN_x$, where $0.9 \leq x \leq 1.2$) (referred as an Si-rich SiN film, hereinafter) is used. Thus, there is provided a nonvolatile semiconductor memory device having improved leakage characteristics of the interpoly dielectric and improved charge retention characteristics, and manufacturing method thereof.

FIG. 1 is a plane view of an example of a NAND-type nonvolatile semiconductor memory device according to the embodiment. One NAND array is shown in the figure. In a NAND-type flash memory, a plurality of cell transistors CG1 to CGn are connected in series. One end of the NAND array is connected to a bit line BL via an nMOS select transistor Q1, and the other end is connected to a source line SL via another nMOS select transistor Q2. Control gate electrodes of the cell transistors CG1 to CGn connect in common with control gate electrodes of a plurality of cell transistors (not shown) arrayed in a vertical direction of the figure so that the control gate electrodes can function as word lines WL1 to WLn. A gate electrode of the select transistor Q1 is connected to a select line SG1, and a gate electrode of the select transistor Q2 is connected to another select line SG2.

Figure 2:
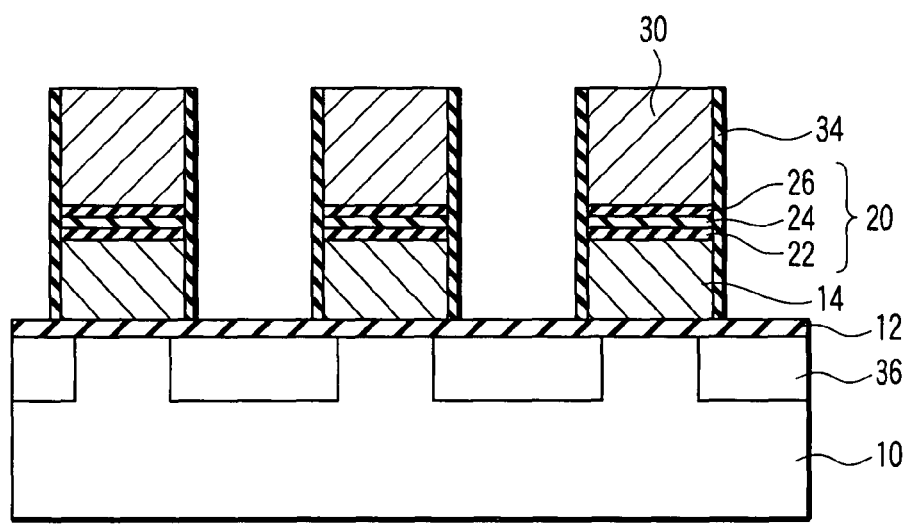
FIG. 2 shows an example of a sectional structure of a cell transistor of the NAND-type nonvolatile semiconductor memory device along a cutting line A-A of FIG. 1, according to the first embodiment.

FIG. 2 shows an example of a sectional structure of a cell transistor of the NAND-type nonvolatile semiconductor memory device along a cutting line A-A of FIG. 1, according to the embodiment. Each cell transistor includes a first gate electrode (floating gate electrode) 14 formed on a gate insulator 12 on a semiconductor substrate 10, and a second gate electrode (control gate electrode) 30 formed on an interpoly dielectric 20 on the first gate electrode 14. The interpoly dielectric 20 disposed between the first and second gate electrodes 14 and 30 includes a first $SiO_2$ film 22, an Si-rich SiN film 24, and a second $SiO_2$ film 26.

In the floating gate type nonvolatile semiconductor memory device, hot electrons generated by a current flowing between a source and a drain 36 of the cell transistor are injected into the floating gate electrode 14 through the gate insulator 12. The number of electrons (amount of charge) injected and stored in the floating gate electrode 14 determine a memory information. Retaining of the charge stored in the floating gate electrode 14 leads to improvement of reliability of the nonvolatile semiconductor memory device. According to the embodiment, the interpoly dielectric 20 including the Si-rich SiN film 24 is used. Thus, a leak current from the floating gate electrode 14 to the control gate electrode 30 through the interpoly dielectric 20 can be reduced. As a result, it can be improved charge retention characteristics of the nonvolatile semiconductor memory device.

An example of a method for manufacturing the NAND-type nonvolatile semiconductor memory device of the embodiment will be described by referring to sectional diagrams shown in FIGS. 3A to 3C.

Figure 3A:
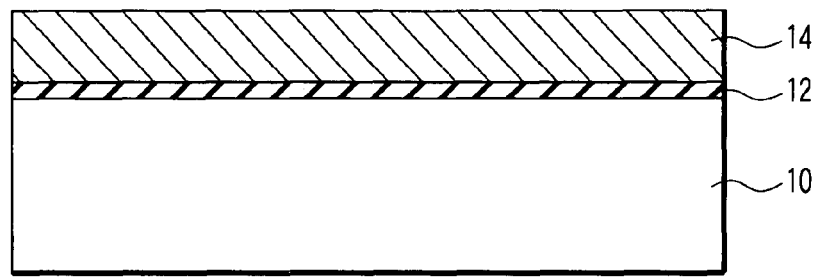
FIGS. 3A to 3C are sectional diagrams showing an example of a manufacturing method of the NAND-type nonvolatile semiconductor memory device according to the first embodiment.

(1) Referring to FIG. 3A, a gate insulator 12 is formed on a semiconductor substrate 10, e.g., a silicon substrate. For the gate insulator 12, for example, an $SiO_2$ film formed by thermally oxidizing the silicon substrate 10 can be used. For example, the gate insulator 12 has a film thickness of 3 nm, and functions as a tunneling insulator.

Then, a first conductor film 14 is deposited on the gate insulator 12. For the first conductor film 14, for example, an amorphous silicon film formed by CVD can be used. The amorphous silicon film 14 is doped with, for example, phosphorus (P) or arsenic (As). The first conductor film 14 is patterned into a floating gate electrode (FG) in a later process.

To separate the first conductor film 14 in a direction vertical to a paper surface, a groove (not shown) parallel to the paper surface is formed in the first conductor film 14 by lithography and etching, and filled with an insulator.

Figure 3B:
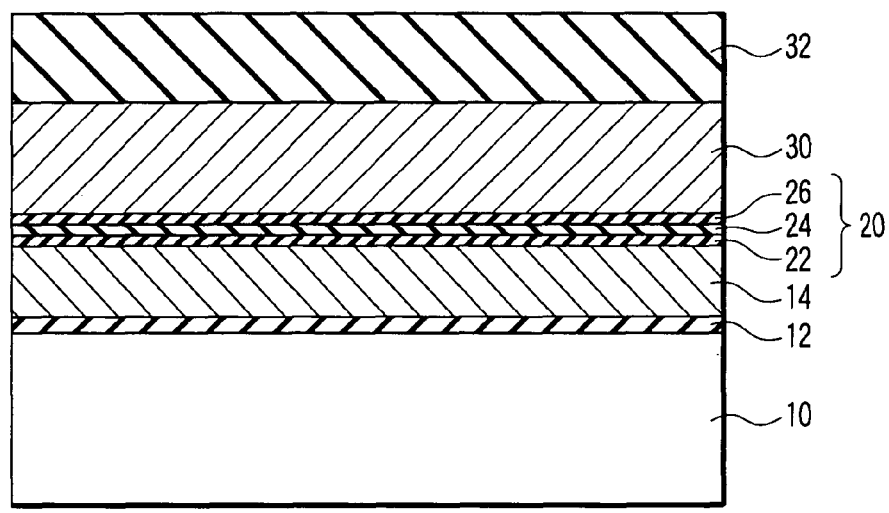
Figure 3C:
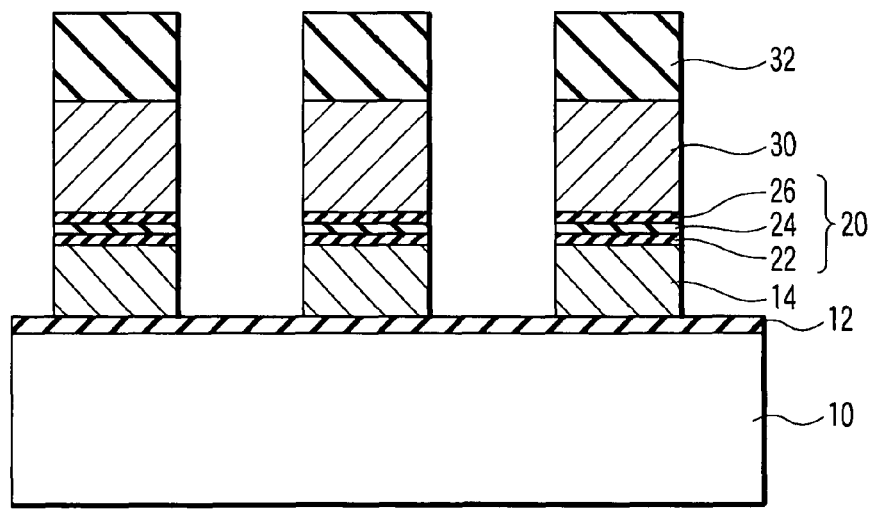

(2) Referring to FIG. 3B, an interpoly dielectric 20 is formed on a whole surface. First, for example, a first $SiO_2$ film 22 is deposited by CVD. An Si-rich SiN film 24 is formed on the first $SiO_2$ film 22. A method for forming the Si-rich SiN film 24 will be described below in detail. A second $SiO_2$ film is deposited on the Si-rich SiN film 24. Although thickness of the films depends on a device design, for example, the first $SiO_2$ film 22/the Si-rich SiN film 24/the second $SiO_2$ film=3 nm/3 to 5 nm/3 nm can be set. In one embodiment, the first $SiO_2$ film can be omitted.

Then, a second conductor film 30 is deposited on a whole surface including on the interpoly dielectric 20. For the second conductor film 30, a doped amorphous silicon film can be used, as in the first conductor film 14. The second conductor film 30 is patterned into a control gate electrode (CG) in a later process. Further, a cap insulator 32 is deposited on a whole surface of the second conductor film 30. For the cap insulator 32, for example, an $Si_3N_4$ film formed by low-pressure CVD (LPCVD) can be used.

(3) Then, a resist film (not shown) is formed on the cap insulator 32, and a pattern of a control gate electrode is formed in the cap insulator 32 by lithography and etching. The resist film is removed, and then the second conductor film 30, the interpoly dielectric 20, and the first conductor film 14 are etched substantially vertically by, e.g., reactive ion etching (RIE) using the cap insulator 32 as a mask. Accordingly, a gate electrode structure shown in FIG. 3C can be formed.

(4) Next, referring back to FIG. 2, a third $SiO_2$ film 34 is formed on a side face of the gate electrode by thermal oxidation. This third $SiO_2$ film 34 is also referred as a post oxide film. Post oxidation also has an effect of, for example, causing recovery from damages introduced to side faces of the gate electrode and the gate insulator 12 by RIE.

Then, by using the gate electrode as a mask, for example, arsenic (As) ions are implanted into the semiconductor substrate 10 to form a diffusion layer 36. The diffusion layer 36 functions as a source/drain of the cell transistor.

Accordingly, the memory cell transistor of the nonvolatile semiconductor memory device of the embodiment shown in FIG. 2 can be formed.

Subsequently, processes necessary for a semiconductor device manufacturing, such as forming multilevel wirings, are executed to complete the nonvolatile semiconductor device of the embodiment.

Figure 4:
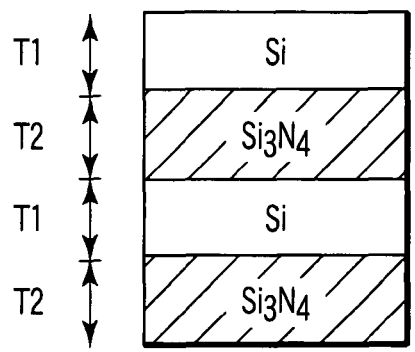
FIG. 4 is a diagram showing an example of a method for forming a silicon-rich silicon nitride film according to the first embodiment.

A method for forming the Si-rich SiN film will be described below in detail. A film thickness of the Si-rich SiN film is, for example, 3 to 5 nm in this embodiment. Such a very thin Si-rich SiN film is a film which includes only 15 to 20 atomic (molecular) layers. Accordingly, to control a composition of the Si-rich SiN film, formation of the film must be controlled in an atomic (molecular) level. For example, atomic-level film formation can be carried out by atomic layer deposition (ALD), molecular beam deposition, ion beam deposition or the like. Specifically, as shown in FIG. 4, the Si-rich SiN film is formed by alternately stacking Si layers of each having several atomic layers (T1 layers) and $Si_3N_4$ layers each having a stoichiometric composition and several molecular layers (T2 layers), thereby forming an $SiN_x$ film having a desired composition of silicon (Si) and nitrogen (N) as a whole. For example, a ratio of the Si layers and $Si_3N_4$ layers (T1/T2) will be T1/T2=0.33 in the case of x=1.2, and T1/T2=1.44 in the case of x=0.9. If the $SiN_x$ film includes 15 atomic (molecular) layers, the Si film includes 8.85 atomic layers, and the $Si_3N_4$ film includes 6.15 molecular layers in the case of x=0.9. As each of the Si and $Si_3N_4$ films is preferably deposited by dividing into at least two film sub-layers to control the Si-rich SiN film composition uniformly, the number of molecular layers of the $Si_3N_4$ film cannot be reduced further. Thus, it is unrealistic to form a more Si-rich SiN film, i.e., an Si-rich $SiN_x$ film of x<0.9. The Si-rich SiN film can be used as the aforementioned laminated film. However, it can be used as an Si-rich SiN film with a substantially uniform composition over an entire film thickness by executing heat treatment after the deposition of the laminated film.

It is not easy to measure a composition of such a very thin film accurately. However, for example, it can be measured by transmission electron microscopy in conjunction with electron energy loss spectroscopy (TEM-EELS).

Figure 5:
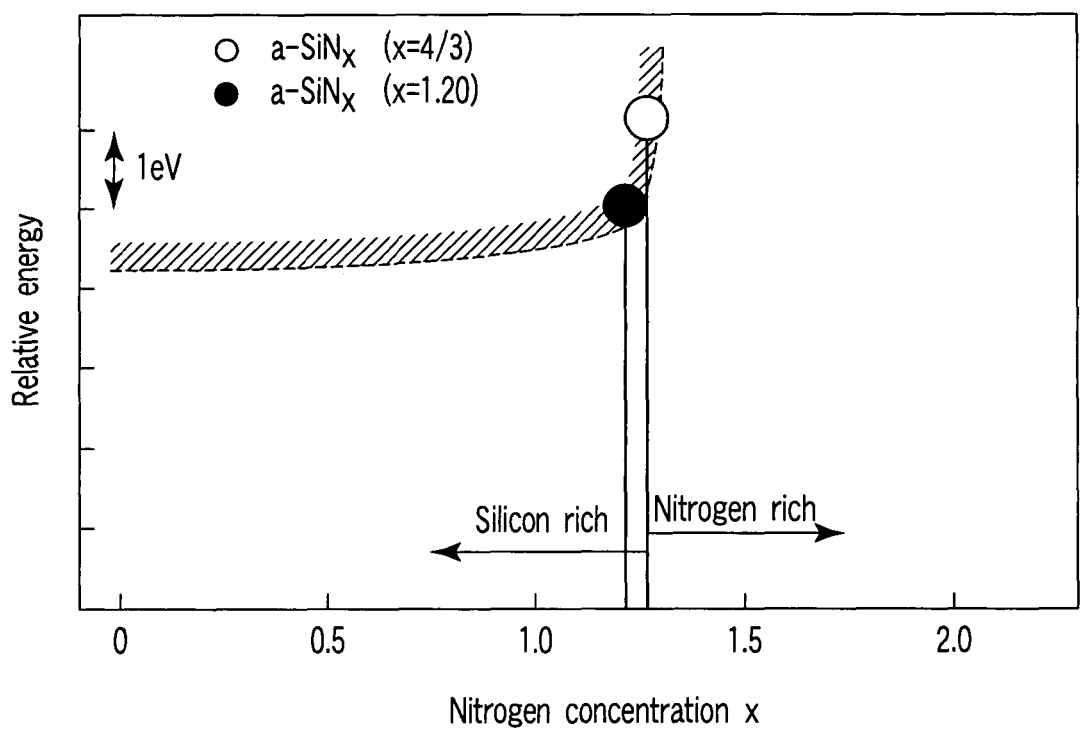
FIG. 5 is a diagram showing change of energy at a conduction band edge of the silicon nitride film as a function of nitrogen concentration in the silicon nitride film.

Next, a mechanism which enables improvement of leakage characteristics of the interpoly dielectric 20 according to the embodiment will be described by referring to FIGS. 5 and 6. FIG. 5 is a diagram showing an energy change at a conduction band edge of the silicon nitride film ($SiN_x$) as a function of a nitrogen concentration in the silicon nitride film. This is based on findings by R. Karcher et al. (Physical Review B, Vol. 30, p. 1986 (1984)). According to the findings, by changing the composition of the silicon nitride film from a stoichiometric composition (x=1.33) to an Si-rich composition, energy at the conduction band edge steeply drops, and almost no change occurs at $x \leqq 1.0$. An energy difference between the Si-rich SiN film of the present invention ($0.9 \leqq x \leqq 1.2$) and a conventional $Si_3N_4$ film (i.e., $SiN_x$:x=1.33) (white circle) is large, and an energy difference is estimated to be 1.1 eV even in the case of x=1.2 (black circle). In other words, setting Si to be rich, a work function of the SiN film is increased by an amount equal to the energy change at the conduction band edge.

Figure 6:
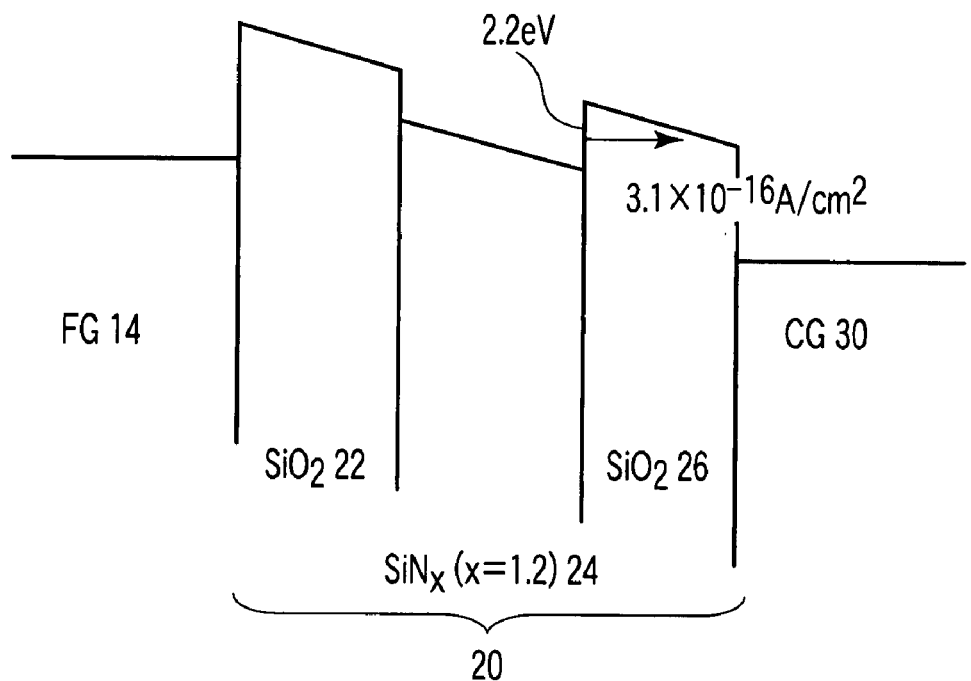
FIG. 6 is an energy band diagram of an interpoly dielectric according to the first embodiment.
Figure 7:
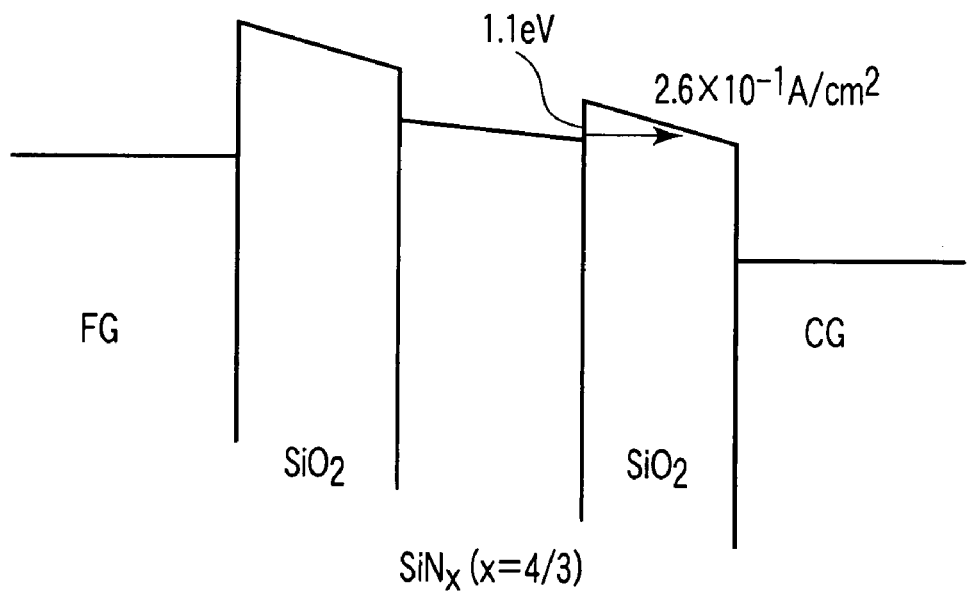
FIG. 7 is an energy band diagram of an interpoly dielectric according to a conventional technology.

FIG. 6 is an energy band diagram of the interpoly dielectric according to the embodiment, showing a conduction band relating conduction of electron. FIG. 7 is an energy band diagram of an interpoly dielectric according to a conventional technology shown for comparison. In the case of the conventional technology, a work function difference, i.e., a barrier height, between the $Si_3N_4$ film and the second $SiO_2$ film is 1.1 eV. On the other hand, according to the embodiment, even in the case of x=1.2, a barrier height between the Si-rich $SiN_x$ film and the second $SiO_2$ film 26 becomes larger, i.e., 1.1 eV+1.1 eV=2.2 eV. This means that the flow of electrons from the $SiN_x$ film to the second $SiO_2$ film becomes difficult.

If the ONO film of the embodiment is used for the interpoly dielectric, some of the electrons stored in the floating gate electrode flow from the floating gate electrode to the $Si_3N_4$ film tunneling through the first $SiO_2$ film and are trapped in the $Si_3N_4$ film, as described above. A probability of leakage of the electrons trapped in the $Si_3N_4$ film to the control gate electrode through the second $SiO_2$ film is drastically reduced when a barrier height between the $SiN_x$ film and the second $SiO_2$ film becomes large. To estimate leak current by simulation, assuming a film thickness of the second $SiO_2$ film is 3 nm, a leak current is $2.6 \times 10^{-1}$ A/cm$^2$ in the case of the $SiN_x$ film (x=1.33) of the conventional technology. In the case of the $SiN_x$ film (x=1.2) of the embodiment, however, it can be greatly reduced to $3.1 \times 10^{-16}$ A/cm$^2$. As a result, it can be improved charge retention characteristics of the nonvolatile semiconductor memory device.

The embodiment has been described by way of example, in which the ONO film including the first $SiO_2$ film, the Si-rich SiN film, and the second $SiO_2$ film is used as the interpoly dielectric. However, the embodiment can be modified to use the interpoly dielectric including only the Si-rich SiN film and the second $SiO_2$ film by omitting the first $SiO_2$ film. In other words, the embodiment can be applied to a structure having at least an $SiO_2$ film between the $SiN_x$ film and the control gate electrode.

As apparent from the foregoing, according to the embodiment, it can be provided a nonvolatile semiconductor memory device of excellent charge retention characteristics by using the interpoly dielectric with improved leakage characteristics, and manufacturing method thereof.

Second Embodiment

According to a second embodiment of the present invention, an interpoly dielectric including an $Si_3N_4$ film in which hydrogen concentration is reduced to 1% or less (referred as a low hydrogen $Si_3N_4$ film, hereinafter) is used. Accordingly, a nonvolatile semiconductor memory device in which leak current characteristics of the interpoly dielectric are improved and charge retention characteristics are improved, and manufacturing method thereof are provided.

Figure 8:
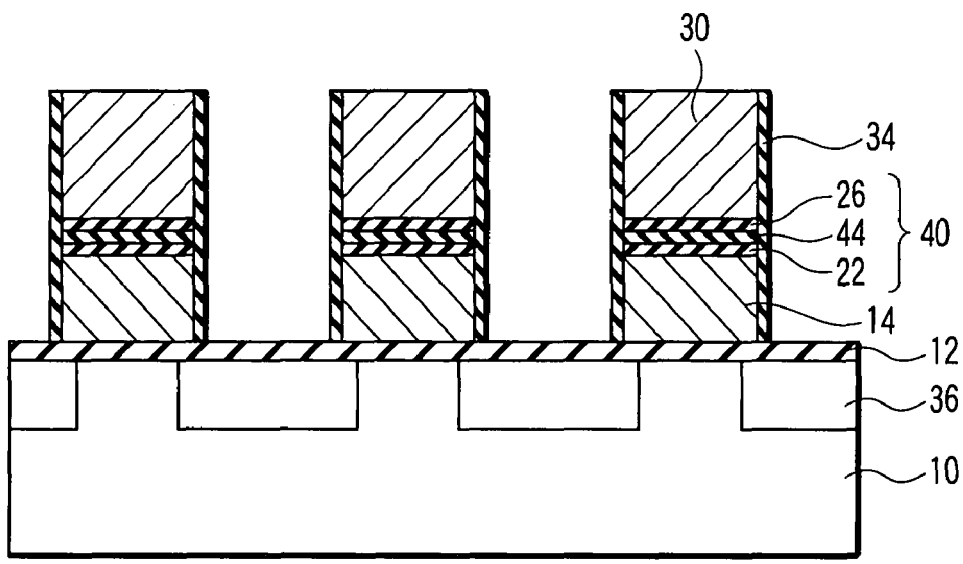
FIG. 8 shows an example of a sectional structure of a cell transistor of a NAND-type nonvolatile semiconductor memory device along a cutting line A-A of FIG. 1, according to a second embodiment of the present invention.

FIG. 8 shows an example of a sectional structure of a cell transistor of a NAND-type nonvolatile semiconductor memory device according to the embodiment. As in the case of FIG. 2, it is a sectional diagram cut along the line A-A of FIG. 1. As in the case of the first embodiment, each cell transistor includes a first electrode (floating gate electrode) 14 formed on a gate insulator 12 on a semiconductor substrate 10, and a second gate electrode (control gate electrode) 30 formed on an interpoly dielectric 40 on the first gate electrode 14. However, this embodiment is different from the first embodiment in that the interpoly insulation film 40 includes a low hydrogen $Si_3N_4$ film, specifically, a first $SiO_2$ film 22, the low hydrogen $Si_3N_4$ film 44, and a second $SiO_2$ film 26 are included. The low hydrogen $Si_3N_4$ film is an $Si_3N_4$ film with a hydrogen content of 1% or less.

In the nonvolatile semiconductor memory device of the embodiment, the interpoly dielectric 40 including the low hydrogen $Si_3N_4$ film is used. Accordingly, leak current caused by leakage of electrons stored in the floating gate electrode 14 to the control gate electrode 30 through the interpoly dielectric 40 can be reduced. As a result, it can be improved charge retention characteristics of the nonvolatile semiconductor memory device.

A method for manufacturing the nonvolatile semiconductor memory device of the embodiment is almost similar to that of the first embodiment except for formation of the low hydrogen $Si_3N_4$ film, and thus detailed description thereof will be omitted.

The low hydrogen $Si_3N_4$ film can be formed by the following method. The $Si_3N_4$ film is generally formed by CVD. According to the conventional technology, hydrogen is contained in the $Si_3N_4$ film because of use of a hydrogen compound as a CVD source gas. A generally used source gas is a combination of ammonium ($NH_4$) and monosilane ($SiH_4$) or dichlorosilane ($SiH_2Cl_2$). Accordingly, the formed $Si_3N_4$ film contains hydrogen of at least 1 to 5%, or several tens of % at the most.

Thus, according to the embodiment, for example, trichlorosilane ($SiCl_4$) or hexachlorodisilane ($Si_2Cl_6$) which contains no hydrogen is used in place of the silicon source gas described above, and CVD is carried out by using $NH_4$ as a nitrogen source gas. As a result, it can be reduced a hydrogen concentration in the $Si_3N_4$ film to 1% or less.

To further reduce the hydrogen concentration, radical nitrogen can be used as a nitrogen source in place of $NH_4$. For example, the radical nitrogen can be generated by subjecting nitrogen gas to plasma processing. By using the radical nitrogen and the silicon source gas containing no hydrogen to carry out CVD, it can be formed an $Si_3N_4$ film which contains substantially no hydrogen.

By using the low hydrogen $Si_3N_4$ film thus formed for an interpoly dielectric, it can be provided a nonvolatile semiconductor memory device improved in leak current characteristics of the interpoly dielectric and in charge retention characteristics, and manufacturing method thereof.

Figure 9:
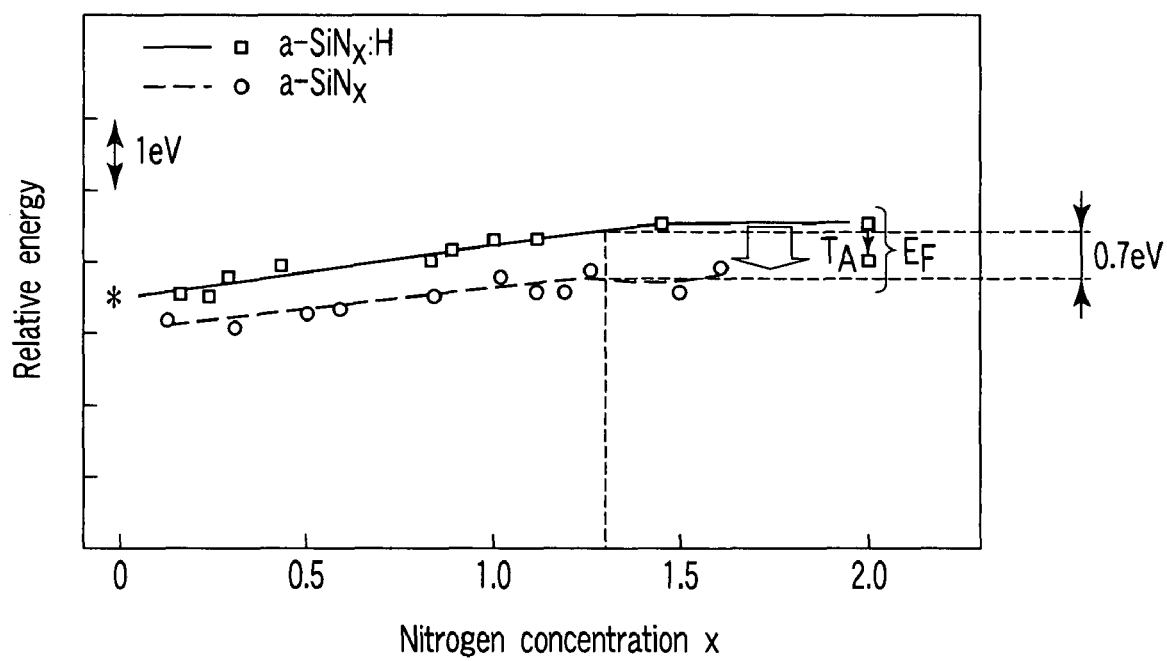
FIG. 9 is a diagram showing Fermi levels of silicon nitride films containing different hydrogen concentrations.

Next, referring to FIG. 9, a mechanism of improving leak current characteristics of the interpoly dielectric 40 according to the embodiment will be described. FIG. 9 shows Fermi levels of $Si_3N_4$ films having different hydrogen concentrations by R. Karcher et al., as in FIG. 5. The conventional $Si_3N_4$ film containing hydrogen of 5 to 10% is indicated by a solid line, and the $Si_3N_4$ film of the embodiment with a hydrogen concentration of 1% or less is indicated by a broken line. As compared with the conventional $Si_3N_4$ film containing hydrogen, Fermi level of the low hydrogen $Si_3N_4$ film is lower by about 0.7 eV. The reduction in Fermi level indicates that a presence probability of electrons in the $Si_3N_4$ film is higher in a deeper position apart from a conduction band, i.e., a deeper position within a forbidden band. As a result, a probability of electrons excited to the conduction band is lowered to enable reduction of a leak current from the $Si_3N_4$ film to the control gate electrode through the second $SiO_2$ film. If energy between the conduction band and the Fermi level becomes large by 0.7 eV in the low hydrogen $Si_3N_4$ film, electrons conducting through the $Si_3N_4$ film are reduced by about $1 \times 10^{-12}$ times based on a relation of exp(–0.7 eV/kT), where, k is the Boltzmann constant, and T is an absolute temperature.

Furthermore, the CVD-$Si_3N_4$ film has many dangling bonds (unconnected bonds), and the dangling bonds serve as electron trap sites. Hydrogen in the $Si_3N_4$ film fills the trap sites to be inactive. Accordingly, by lowering the hydrogen concentration to 1% or less, electron trap sites made inactive by hydrogen can be reduced, in other words, many trap sites can be remained active. As a result, electrons trapped in the $Si_3N_4$ film become difficult to be emitted, whereby leak current from the $Si_3N_4$ film to the control gate electrode can be reduced.

As in the case of the first embodiment, the embodiment can be modified to omit the first $SiO_2$ film from the 3-layer interpoly dielectric, thus an interpoly dielectric constituted of a low hydrogen $Si_3N_4$ film and a second $SiO_2$ film can be used.

As apparent from the foregoing, according to the embodiment, it can be provided a nonvolatile semiconductor memory device of excellent charge retention characteristics by using the interpoly dielectric with improved leakage characteristics, and manufacturing method thereof.

Third Embodiment

A third embodiment of the present invention is directed to a MONOS-type nonvolatile semiconductor memory device in which an Si-rich $SiN_x$ film ($0.9 \leq x \leq 1.2$) is used for a charge storage film, and manufacturing method thereof.

Figure 10:
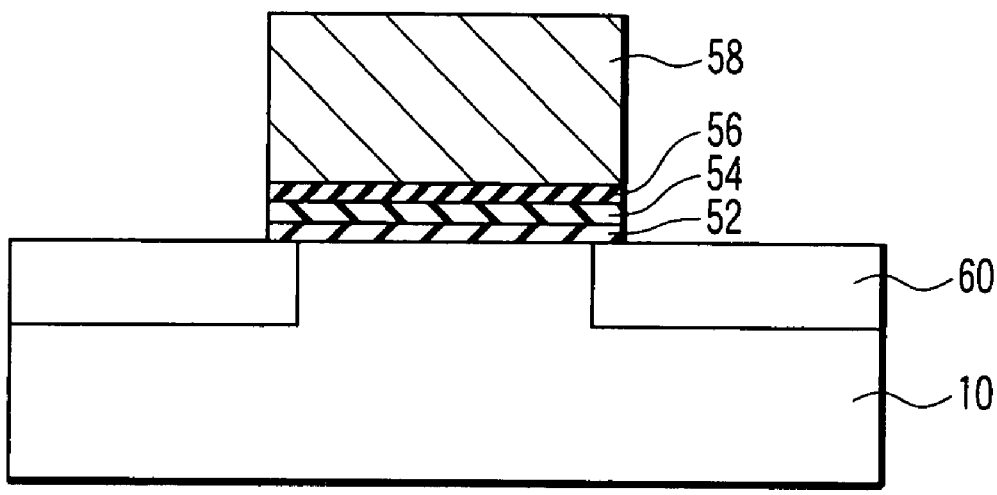
FIG. 10 shows an example of a sectional structure of a cell transistor of a MONOS-type nonvolatile semiconductor memory device according to a third embodiment of the present invention.

FIG. 10 shows an example of a sectional structure of a cell transistor of a MONOS-type nonvolatile semiconductor memory device according to the embodiment. The memory cell of the embodiment includes a charge storage film 54 formed on a tunneling insulator 52 on a semiconductor substrate 10, and a gate electrode (control gate electrode) 58 formed on a blocking insulator 56 on the charge storage film 54. According to the present embodiment, the charge storage film 54 is made of an Si-rich SiN film, and the blocking insulator 56 is made of an $SiO_2$ film.

In the MONOS-type nonvolatile semiconductor memory device, hot electrons generated by a current flowing between sources/drains 60 of the memory cell are passed through the tunneling insulator 52 and stored in the charge storage film 54. Memory information is determined based on the amount of electrons (amount of charge) stored in the charge storage film 54. According to the embodiment, the Si-rich $SiN_x$ film ($0.9 \leq x \leq 1.2$) is used for the charge storage film 54. Thus, it can be reduced a leak current from the charge storage film 54 to a control gate electrode 58 through the blocking insulator 56 according to the mechanism described above. As a result, it can be improved charge retention characteristics of the nonvolatile semiconductor memory device.

Referring to FIG. 10, an example of a method for manufacturing the MONOS-type nonvolatile semiconductor memory device of the embodiment will be described.

A tunneling insulator 52 is formed on a semiconductor substrate 10 such as a silicon substrate. For the tunneling insulator 52, for example, an $SiO_2$ film formed by thermally oxidizing the silicon substrate 10 can be used, and its film thickness is, e.g., 3 nm. In addition to the $SiO_2$ film, for the tunneling insulator 52, for example, an oxynitride film obtained by nitriding an $SiO_2$ film can be used.

A charge storage film 54 is deposited on the tunneling insulator 52. The charge storage film 54 is an Si-rich $SiN_x$ film ($0.9 \leq x \leq 1.2$), and its film thickness is, e.g., 3 to 5 nm. The Si-rich SiN film can be formed as in the case of the first embodiment, and a laminated or alternate laminated film of Si layer(s) and $Si_3N_4$ layer(s) formed by, e.g., ALD, and by controlling at an atomic (molecular) layer level.

A blocking insulator 54 is deposited on the Si-rich SiN film 54. For example, an $SiO_2$ film formed by CVD can be used for the blocking insulator 56, and its film thickness is, e.g., 5 nm. For the blocking insulator 56, in addition to the $SiO_2$ film, a laminated film containing at least a high dielectric constant insulator such as an aluminum oxide film ($Al_2O_3$) or a lanthanum aluminum oxide film ($LaAlO_3$) can be used.

Then, a conductor film 58 is deposited on a whole surface including on the blocking insulator 56. For the conductor film 58, as in the case of the conductor films 14, 30 of the first embodiment, a doped amorphous silicon film can be used. Further, for the gate electrode 58, a polycide electrode including polysilicon and silicide, a FUSI electrode fully silicided across the entire electrode thickness or a metal electrode can be used. The conductor film 58 is patterned into a control gate electrode later. A cap insulator (not shown) is deposited on a whole surface of the conductor film 58. For the cap insulator, for example, an $Si_3N_4$ film formed by LPCVD can be used.

Subsequently, patterning of the gate electrode or the like is executed by a process similar to that of the step (3) and after of the first embodiment to complete the memory cell of the nonvolatile semiconductor memory device of the embodiment.

A mechanism of the embodiment for suppressing a leak current from the charge storage film 54 to the control gate electrode 58 through the blocking insulator 56 is similar to that described above with reference to FIGS. 5 and 6. That is, it is because a barrier height between the charge storage film 54 constituted of the Si-rich SiN film and the blocking insulator 56 constituted of the $SiO_2$ film can be set large.

Thus, by using the charge storage film constituted of the Si-rich SiN film according to the embodiment, it can be provided a MONOS-type nonvolatile semiconductor memory device capable of reducing leak current from a charge storage film to a control gate electrode and having excellent charge storage characteristics, and manufacturing method thereof.

MODIFIED EXAMPLE

Figure 11:
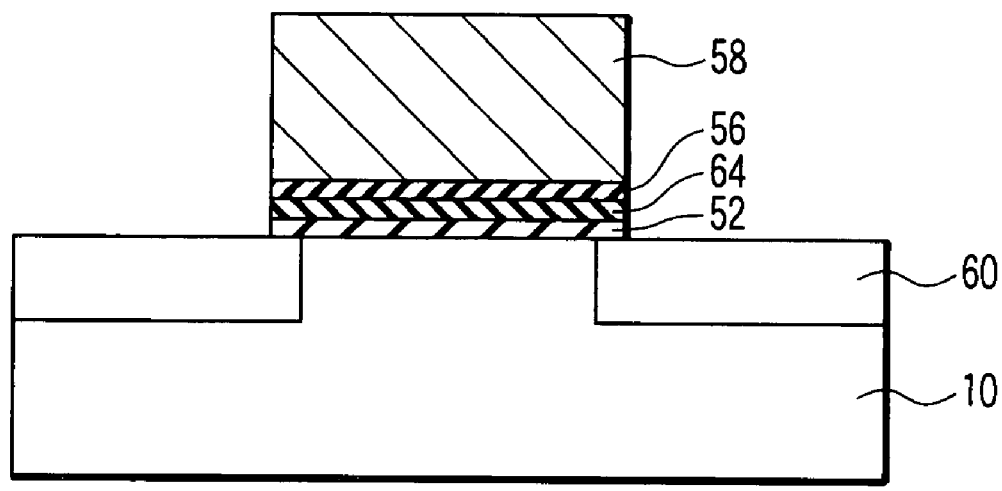
FIG. 11 shows an example of a sectional structure of a cell transistor of a MONOS-type nonvolatile semiconductor memory device according to a modified example of the present invention.

According to a modified example, as shown in FIG. 11, even in the MONOS-type nonvolatile semiconductor memory device, a low hydrogen $Si_3N_4$ film 64 can be used for a charge storage film 64 in place of the Si-rich SiN film, as in the case of the second embodiment. In this case, a mechanism of suppressing leak current from the charge storage film 64 to a control gate electrode 58 through a blocking insulator 56 is the same as that of the second embodiment described above with reference to FIG. 9. In other words, Fermi level of the charge storage film 64 constituted of the low hydrogen $Si_3N_4$ film can be lowered, whereby increasing a barrier height between the low hydrogen $Si_3N_4$ film 64 and the blocking insulator ($SiO_2$ film) 56. As a result, it can be reduced leak current from the charge storage film 64 to the control gate electrode 58 through the blocking insulator 56. Thus, it can be provided a MONOS-type nonvolatile semiconductor memory device of excellent charge storage characteristics, and manufacturing method thereof.

As described above, according to the present invention, it can be provided a nonvolatile semiconductor memory device capable of improving leakage characteristics of an insulator between a charge storage film and a control gate electrode and charge retention characteristics, and manufacturing method thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device including an array of cell transistors, each cell transistor comprising:
    a first insulator formed on a semiconductor substrate;
    a first electrode disposed on the first insulator;
    a second insulator disposed on the first electrode and continuously disposed in one direction across a plurality of the cell transistors;
    a second electrode disposed on the second insulator and continuously disposed in the one direction; and
    diffusion layers disposed in the semiconductor substrate, the first and second electrodes disposed between adjacent ones of the diffusion layers,
    wherein the second insulator includes:
        a first silicon oxide film;
        a silicon-rich silicon nitride film formed on the first silicon oxide film and substantially uniformly containing more silicon than that in a silicon nitride film with a stoichiometric composition over an entire film thickness; and
        a second silicon oxide film formed on the silicon-rich silicon nitride film, and
    wherein the silicon-rich silicon nitride film has a ratio of a silicon concentration and a nitrogen concentration set to 1:0.9 to 1:1.2 ($SiN_x$, where $0.9 \leq x \leq 1.2$).

2. The semiconductor memory device according to claim 1, wherein the silicon-rich silicon nitride film is formed of an alternately laminated film including at least two stacks of silicon atomic layers and at least two stacks of silicon nitride molecular layers having a stoichiometric composition.

3. The semiconductor memory device according to claim 2, wherein, in the laminated film, a ratio of layer numbers between total silicon atomic layers and total silicon nitride molecular is 0.33:1 to 1.44:1.

4. The semiconductor memory device according to claim 1, wherein the silicon-rich silicon nitride film has a film thickness of 3 to 5 nm.

5. The semiconductor memory device according to claim 1, wherein a barrier height between the silicon-rich silicon nitride film and the second silicon oxide film is at least 2.2 eV.

6. The semiconductor memory device according to claim 2, wherein each stack of the silicon atomic layers includes a few atomic layers thereof and each stack of the silicon nitride molecular layers includes a few molecular layers thereof.

* * * * *